(12) United States Patent
Suzuki et al.

(10) Patent No.: US 10,263,181 B2
(45) Date of Patent: Apr. 16, 2019

(54) LAMINATED STRUCTURE AND SPIN MODULATION ELEMENT

(71) Applicant: TDK CORPORATION, Tokyo (JP)

(72) Inventors: Eiji Suzuki, Tokyo (JP); Katsuyuki Nakada, Tokyo (JP); Shogo Yonemura, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/994,057

(22) Filed: May 31, 2018

(65) Prior Publication Data

US 2018/0351090 A1    Dec. 6, 2018

(30) Foreign Application Priority Data

May 31, 2017  (JP) ................................. 2017-108299

(51) Int. Cl.
| | |
|---|---|
| H01L 27/11585 | (2017.01) |
| H01L 27/115 | (2017.01) |
| H01L 43/08 | (2006.01) |
| H01F 10/32 | (2006.01) |
| H01L 43/10 | (2006.01) |
| H01L 21/28 | (2006.01) |

(52) U.S. Cl.
CPC ......... *H01L 43/08* (2013.01); *H01F 10/3268* (2013.01); *H01L 43/10* (2013.01); *H01L 21/28291* (2013.01); *H01L 27/11585* (2013.01)

(58) Field of Classification Search
CPC ......... H01L 21/28291; H01L 27/11585; H01F 10/3268
See application file for complete search history.

(56) References Cited

U.S. PATENT DOCUMENTS

| | | | | |
|---|---|---|---|---|
| 5,756,191 A | * | 5/1998 | Hashimoto | ............ B82Y 25/00 |
| | | | | 257/E43.005 |
| 6,146,775 A | * | 11/2000 | Fujita | ..................... B82Y 10/00 |
| | | | | 257/E43.005 |
| 7,573,734 B2 | | 8/2009 | Grino et al. | |
| 7,888,138 B2 | * | 2/2011 | Shin | .................. H01L 21/31691 |
| | | | | 257/E21.208 |
| 9,356,224 B2 | | 5/2016 | Zeches et al. | |

(Continued)

FOREIGN PATENT DOCUMENTS

| | | |
|---|---|---|
| JP | 2016-063024 A | 4/2016 |
| JP | 2016-063062 A | 4/2016 |
| JP | 2016-111102 A | 6/2016 |

OTHER PUBLICATIONS

Yue Wang et al., "Epitaxial growth of BiFeO3 films on TiN under layers by sputtering deposition", AIP Advances 7, 055815-1 to 055815-6, 2017.

*Primary Examiner* — George R Fourson, III
(74) *Attorney, Agent, or Firm* — Oliff PLC

(57) ABSTRACT

To provide a laminated structure and a spin modulation element capable of stably modulating spin polarizability of a ferromagnetic material by an electric field. A laminated structure according to an embodiment includes: a ferromagnetic layer; and a multiferroic layer formed on one surface of the ferromagnetic layer, wherein the multiferroic layer includes a first region having a rhombohedral crystal structure formed on a surface side on the ferromagnetic layer side and a second region having a tetragonal crystal structure formed further inside than the first region.

20 Claims, 4 Drawing Sheets

(56) References Cited

U.S. PATENT DOCUMENTS

| | | | |
|---|---|---|---|
| 9,520,175 B2 | 12/2016 | Shibata et al. | |
| 2009/0155931 A1* | 6/2009 | Ma | C30B 23/02 438/3 |
| 2009/0206427 A1* | 8/2009 | Oh | H01L 43/08 257/421 |
| 2009/0246543 A1* | 10/2009 | Noh | C30B 23/02 428/469 |
| 2009/0280355 A1* | 11/2009 | Eom | C30B 23/02 428/701 |
| 2010/0102369 A1* | 4/2010 | Tian | G11C 11/22 257/295 |
| 2010/0195381 A1* | 8/2010 | Karg | G11C 11/1675 365/171 |
| 2012/0319533 A1* | 12/2012 | Kubota | B41J 2/14233 310/357 |
| 2014/0043895 A1* | 2/2014 | Bibes | H01L 43/08 365/171 |
| 2015/0123755 A1* | 5/2015 | Shibata | H01F 10/3218 335/296 |
| 2018/0205002 A1* | 7/2018 | Bak | H01L 27/228 |

* cited by examiner

LAMINATED STRUCTURE AND SPIN MODULATION ELEMENT

BACKGROUND OF THE INVENTION

Field of the Invention

The present invention relates to a laminated structure and a spin modulation element.

Priority is claimed on Japanese Patent Application No. 2017-108299, filed May 31, 2017, the content of which is incorporated herein by reference.

Description of Related Art

Elements utilizing spins of magnetic materials have been used for various applications. For example, magnetoresistive effect elements such as giant magnetoresistance (GMR) elements constituted of a multilayer film of a ferromagnetic layer and a nonmagnetic layer and tunneling magnetoresistance (TMR) elements using an insulating layer (tunnel barrier layer or barrier layer) for a nonmagnetic layer are known. Magnetoresistive effect elements have been used for magnetic sensors, high frequency components, magnetic heads, magnetic recording media, nonvolatile random access memories (MRAM), and the like.

Magnetoresistive effect elements output a change in resistance value due to a difference in magnetization direction of two ferromagnetic layers. When a state in which magnetization directions of two ferromagnetic layers are parallel is set to "0" and a state in which magnetization directions of two ferromagnetic layers are anti-parallel is set to "1," the magnetoresistive effect elements can output binary data.

On the other hand, data has been required to be accumulated at a higher density along with an increase in data capacity in recent years. As one of means therefor, the development of elements capable of recording data with multiple values such as binary values or more has progressed. For example, Japanese Unexamined Patent Application, First Publication No. 2016-63024 and Japanese Unexamined Patent Application, First Publication No. 2016-63062 describe elements capable of recording data with multiple values by modulating spin polarizabilities of ferromagnetic layers using electric fields.

SUMMARY OF THE INVENTION

However, in the elements described in Japanese Unexamined Patent Application, First Publication No. 2016-63024 and Japanese Unexamined Patent Application, First Publication No. 2016-63062, there are a case in which a sufficient electric field cannot be generated by dielectric polarization and a case in which the anisotropy of the magnetization of a ferromagnetic layer is not sufficient, and there is a case in which data cannot be stably recorded with multiple values.

The present invention was made in view of the above-described circumstances, and an object thereof is to provide a laminated structure and a spin modulation element which are capable of stably modulating spin polarizability of a ferromagnetic material by an electric field.

In order to achieve the object, the present disclosure is directed to the following aspects.

(1) A laminated structure according to a first aspect includes: a ferromagnetic layer; and a multiferroic layer formed on one surface of the ferromagnetic layer, wherein the multiferroic layer has a first region including a rhombohedral crystal located on a surface side on the ferromagnetic layer side and a second region having a tetragonal crystal located further inside than the first region.

(2) In the laminated structure according to the aspect, a thickness of the first region may be 2 nm or more.

(3) In the laminated structure according to the aspect, one surface of the second region on the ferromagnetic layer side may be present within 300 nm from a surface of the multiferroic layer on the ferromagnetic layer side.

(4) In the laminated structure according to the aspect, a portion of the first region having a rhombohedral crystal structure may occupy an area of 30% or more of one surface of the multiferroic layer when the multiferroic layer is viewed in a plan view in a lamination direction.

(5) In the laminated structure according to the aspect, a portion of the second region having a tetragonal crystal structure may occupy an area of 30% or more of one surface of the multiferroic layer when the multiferroic layer is viewed in a plan view in the lamination direction.

(6) In the laminated structure according to the aspect, a plurality of portions of the first region having a rhombohedral crystal structure may be present and a plurality of portions of the second region having a tetragonal crystal structure may be present.

(7) In the laminated structure according to the aspect, the multiferroic layer may include any one selected from the group consisting of $BiFeO_3$, $BiMnO_3$, $GaFeO_3$, $AlFeO_3$, $(Ga, Al)FeO_3$, $YMnO_3$, $CuFeO_2$, $Cr_2O_3$, $Ni_3Bi_7O_{13}I$, $LiMnPO_4$, $Y_3Fe_5O_{12}$, $TbPO_4$, and $LiCoPO_4$.

(8) In the laminated structure according to the aspect, the ferromagnetic layer may be a half metal.

(9) In the laminated structure according to the aspect, the ferromagnetic layer may include a Heusler alloy represented by a composition expression of $X_2YZ$, X in the composition expression may be a transition metal element or a noble metal element from the Co, Fe, Ni, or Cu group in the periodic table, Y may be a transition metal from the Mn, V, Cr, or Ti group or the element types for X, and Z may be a typical element from Group III to Group V.

(10) A spin modulation element according to a second aspect includes: the laminated structure according to any one of the above aspects; and a nonmagnetic layer and a second ferromagnetic layer sequentially laminated on the ferromagnetic layer of the laminated structure.

The laminated structure and the spin modulation element according to the above aspects can stably modulate spin polarizability of a ferromagnetic material by an electric field.

DETAILED DESCRIPTION OF THE INVENTION

Figure 1:
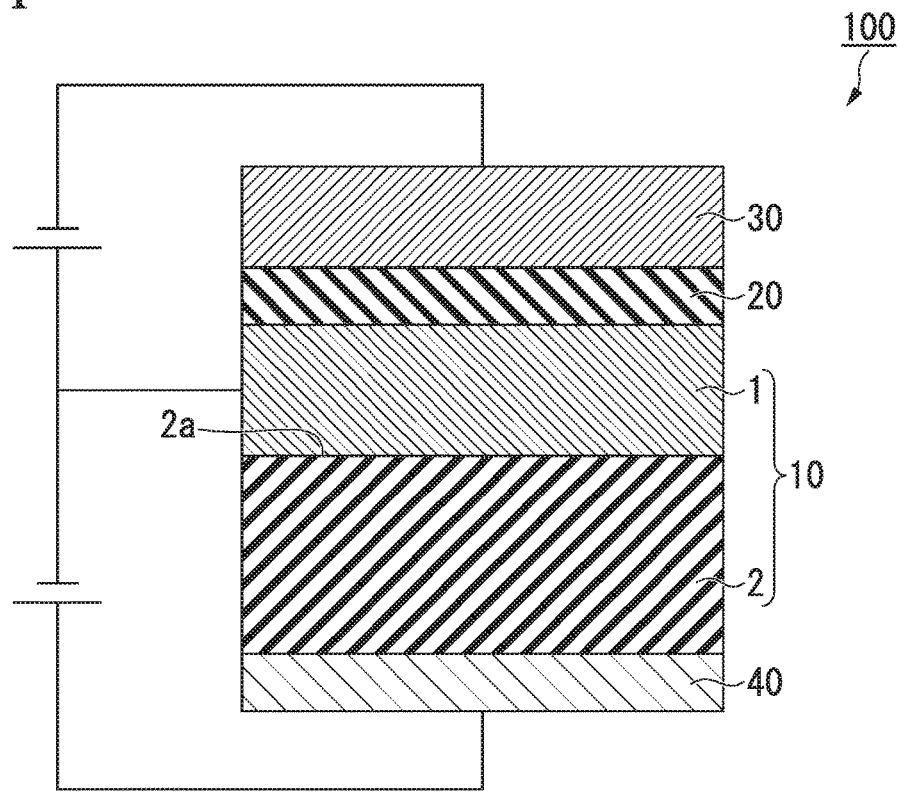
FIG. 1 is a diagram schematically showing a spin modulation element according to an embodiment.

A constitution in an embodiment will be described below with reference to the drawings. In the drawings used in the following description, enlarged characteristic parts are illustrated for convenience for the sake of easier understanding of features in some cases and dimensional proportions or the like of each component element are not necessarily the same as the actual proportions. Furthermore, materials, dimensions, and the like illustrated in the following description are merely examples and the present invention is not limited thereto.

(Spin Modulation Element)

FIG. 1 is a diagram schematically showing a spin modulation element according to an embodiment. A spin modulation element 100 illustrated in FIG. 1 includes a laminated structure 10, a nonmagnetic layer 20, and a second ferromagnetic layer 30.

Also, an electrode 40 may be provided on a surface of a second ferromagnetic layer 30 opposite to the nonmagnetic layer 20 or on a surface of a multiferroic layer 2 opposite to the ferromagnetic layer 1.

"Laminated Structure"

The laminated structure 10 includes a ferromagnetic layer 1 and a multiferroic layer 2. Although the laminated structure 10 is illustrated in FIG. 1 as a part of a constitution of the spin modulation element 100, the laminated structure 10 only can be used for an anisotropic magnetoresistive (AMR) (magnetic anisotropy) sensor or the like.

The ferromagnetic layer 1 includes a magnetic material in which magnetization is oriented in one direction. It is desirable to use a material with strong magnetic anisotropy as a magnetic material constituting the ferromagnetic layer 1. For example, a metal selected from the group consisting of Cr, Mn, Co, Fe, and Ni and an alloy which includes one or more of these metals and has ferromagnetism can be used. Furthermore, an alloy containing one or more of these metals and at least one element of B, C, and N can also be used. To be specific, Fe, Co—Fe, and the like may be exemplified.

Also, the ferromagnetic layer 1 is preferably a half metal. A half metal is a material in which one of electron spins has a metallic band structure and the other of the electron spins has an insulator-like band structure. A half metal ideally has a large spin polarizability close to 1 on a Fermi surface.

Heusler alloys, magnetite ($Fe_3O_4$), perovskite type Mn oxides, and the like are known as half metals, but Heusler alloys are particularly desirable. Heusler alloys have features such as high lattice matching with Group III-V semiconductors, a Curie temperature equal to or higher than room temperature, and a large band gap near a Fermi surface and can have high spin polarizability even at room temperature.

Heusler alloys contain an intermetallic compound having a chemical composition of $X_2YZ$, X is a transition metal element or a noble metal element from the Co, Fe, Ni, or Cu group in the periodic table, Y is a transition metal from the Mn, V, Cr, or Ti group and can also be the types of element for X, and Z is a typical element of Group III to Group V. $Co_2FeSi$, $Co_2MnSi$, $Co_2Mn_{1-a}Fe_aAl_bSi_{1-b}$, and the like may be exemplified.

The multiferroic layer 2 is formed on one surface of the ferromagnetic layer 1. The multiferroic layer 2 contains a multiferroic material which has properties of a magnetic order and a ferroelectric order together. As a multiferroic material, any one selected from the group consisting of $BiFeO_3$, $BiMnO_3$, $GaFeO_3$, $AlFeO_3$, $(Ga,Al)FeO_3$, $YMnO_3$, $CuFeO_2$, $Cr_2O_3$, $Ni_3Bi_7O_{13}I$, $LiMnPO_4$, $Y_3Fe_5O_{12}$, $TbPO_4$, and $LiCoPO_4$ can be used. Furthermore, a material obtained by substituting some elements of the above-described materials with another element within an extent that characteristics thereof are not lost can be used as a multiferroic material. For example, a part of X in a material represented as $XYO_3$ may be substituted with another trivalent element or a part of Y may be substituted with another element serving as a 3 d transition metal. Furthermore, there may be oxygen deficiency or the like occurring in a multiferroic material. Among these materials, $BiFeO_3$ is particularly desirable because a Curie temperature and a Néel temperature of $BiFeO_3$ are high and $BiFeO_3$ exhibits ferroelectric characteristics and ferromagnetism characteristics in a wide temperature range.

Characteristics of a multiferroic material differ depending on its crystal structure. When the crystal structure is rhombohedral, the multiferroic material exhibits both ferroelectric characteristics and ferromagnetism characteristics and particularly has excellent ferromagnetism characteristics. On the other hand, when the crystal structure is tetragonal, the multiferroic material has excellent ferroelectric characteristics, but ferromagnetism characteristics are exhibited to a lesser extent.

The multiferroic layer 2 has at least two effects on the ferromagnetic layer 1. A first effect is derived from ferromagnetism characteristics of the multiferroic layer 2 and a second effect is derived from ferroelectric characteristics of the multiferroic layer 2.

When the multiferroic layer 2 exhibits ferromagnetism characteristics, a magnetization direction of the ferromagnetic layer 1 is strongly oriented in one direction under an effect of the magnetization of the multiferroic layer 2 (the first effect). In other words, the multiferroic layer 2 has an effect of pinning the magnetization of the ferromagnetic layer 1 due to its ferromagnetism characteristics. When the magnetization of the ferromagnetic layer 1 is strongly fixed in one direction, magnetoresistive effects expressed between the ferromagnetic layer 1 and the facing second ferromagnetic layer 30 are increased and a rate of change in resistance (magnetoresistive (MR) ratio) due to magnetoresistive effects is increased.

On the other hand, when the multiferroic layer 2 exhibits ferroelectric characteristics, the multiferroic layer 2 is dielectrically polarized. Charges generated by dielectric polarization induce charges at an interface in the ferromagnetic layer 1 on the multiferroic layer 2 side, and an electric field due to the interface charges changes a band structure of the ferromagnetic layer 1, and modulates spin polarizability of the ferromagnetic layer 1 (the second effect). When the spin polarizability is modulated, multi-valuing of the spin modulation element 100 can be realized. For example, this is because resistance values between the ferromagnetic layer 1 and the second ferromagnetic layer 30 are different when spin polarizability of the ferromagnetic layer 1 is 1.0 and the ferromagnetic layer 1 is parallel to the second ferromagnetic layer 30 and when spin polarizability of the ferromagnetic layer 1 is 0.5 and the ferromagnetic layer 1 is parallel to the second ferromagnetic layer 30.

Regarding the effects of the multiferroic layer 2 on the ferromagnetic layer 1, both of the first effect and the second effect are important. When a crystal structure is rhombohedral, since ferromagnetism characteristics are excellent, the first effect can be exerted on the ferromagnetic layer 1 to a great extent. On the other hand, since ferroelectric characteristics are excellent when a crystal structure is tetragonal, the second effect can be greatly exerted on the ferromagnetic layer 1.

Figure 2:
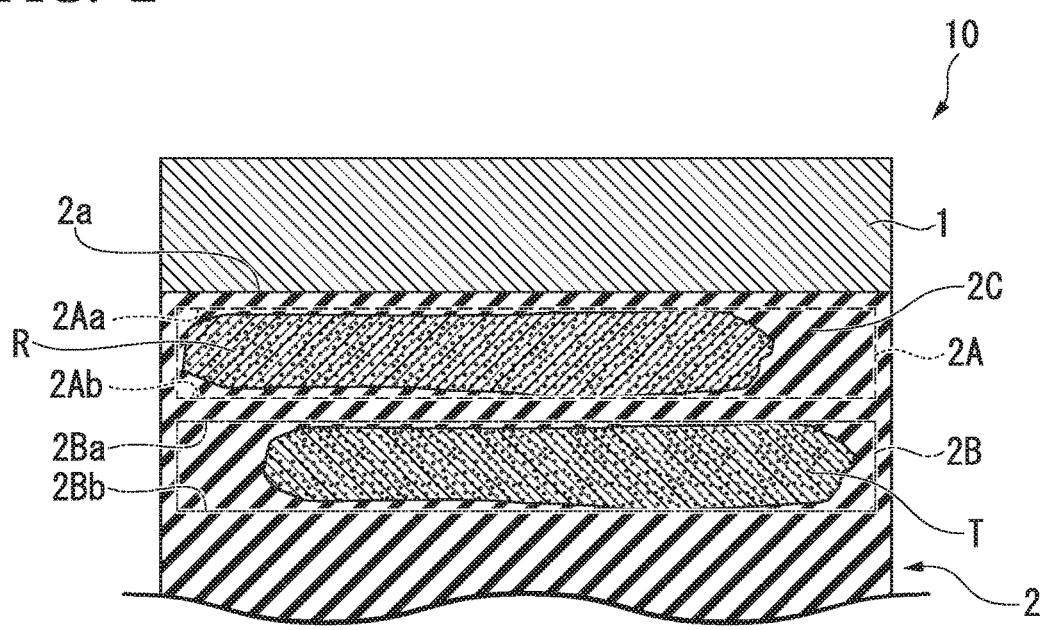
FIG. 2 is a diagram schematically showing a cross section of a laminated structure according to the embodiment.

FIG. 2 is a diagram schematically showing a cross section of the laminated structure 10 according to the embodiment. As illustrated in FIG. 2, the multiferroic layer 2 includes a portion whose crystal structure is rhombohedral (hereinafter referred to as a "rhombohedral crystal region R") and a portion whose crystal structure is tetragonal (hereinafter referred to as a "tetragonal crystal region T"). Here, a tetragonal crystal is not limited to a structure in which a c axis is 90° with respect to an a axis and is allowed to include a structure in which a c axis is 90°±10° with respect to an a axis. Furthermore, the multiferroic layer 2 has a first region 2A and a second region 2B going from a surface 2a thereof on the ferromagnetic layer 1 side. It should be noted that FIG. 2 is a cross-sectional view in an arbitrary cross section including both the rhombohedral crystal region R and the tetragonal crystal region T.

The first region 2A refers to a region between a surface which passes through a portion of the rhombohedral crystal region R closest to the surface 2a side which is closest to the surface 2a side and is perpendicular to a lamination direction (hereinafter referred to as a "first region upper surface 2Aa") and a surface which passes through a portion of the rhombohedral crystal region R closest to the surface 2a side which is farthest from the surface 2a side and is perpendicular to the lamination direction (hereinafter referred to as a "first region lower surface 2Ab"). For this reason, the first region 2A includes the rhombohedral crystal region R.

On the other hand, the second region 2B refers to a region between a surface which passes through a portion of the tetragonal crystal region T closest to the surface 2a side which is closest to the surface 2a side and is perpendicular to the lamination direction (hereinafter referred to as a "second region upper surface 2Ba") and a surface which passes through a portion of the tetragonal crystal region T closest to the surface 2a side which is farthest from the surface 2a side and is perpendicular to the lamination direction (hereinafter referred to as a "second region lower surface 2Bb"). For this reason, the second region 2B includes the tetragonal crystal region T.

The second region 2B is present further inside the multiferroic layer 2 than the first region 2A. Here, a positional relationship between the second region 2B and the first region 2A is determined on the basis of a positional relationship between a surface which passes through a center of the first region 2A in a thickness direction thereof and a surface which passes through a center of the second region 2B in a thickness direction thereof. The "surface which passes through the center of the first region 2A in the thickness direction thereof" is a surface which is parallel to the first region upper surface 2Aa and the first region lower surface 2Ab and equidistant from the first region upper surface 2Aa and the first region lower surface 2Ab. In addition, the "surface which passes through the center of the second region 2B in the thickness direction thereof" is a surface which is parallel to the second region upper surface 2Ba and the second region lower surface 2Bb and equidistant from the second region upper surface 2Ba and the second region lower surface 2Bb.

For this reason, whether the second region 2B is present further inside the multiferroic layer 2 than the first region 2A is determined on the basis of the positional relationship between the surface which passes through the center of the first region 2A in the thickness direction thereof and the surface which passes through the center of the second region 2B in the thickness direction thereof even when the first region lower surface 2Ab is present further inside the multiferroic layer 2 than the second region upper surface 2Ba and the first region 2A and the second region 2B overlap.

Also, the first region 2A and the second region 2B may include a portion (third region) 2C whose crystal phase is neither tetragonal nor rhombohedral. This portion 2C includes, for example, a region whose crystal structure transitions between a tetragonal crystal and a rhombohedral crystal, an amorphous region, a region whose crystal structure is disordered, a hetero-phase, and the like. When there is the portion 2C on the surface 2a of the multiferroic layer 2, a difference in lattice constant between the ferromagnetic layer 1 and the multiferroic layer 2 can be relaxed due to the portion 2C so that lattice matching between the ferromagnetic layer 1 and the multiferroic layer 2 can be enhanced.

A crystal structure of a region in the multiferroic layer 2 other than the first region 2A and the second region 2B is not particularly limited. The crystal structure of this region may be tetragonal, rhombohedral, or a crystal structure in which these are mixed.

When the multiferroic layer 2 has the rhombohedral crystal region R and the tetragonal crystal region T and the second region 2B is present further inside than the first region 2A, the first effect and the second effect can be effectively exerted on the ferromagnetic layer 1. Furthermore, since lattice matching of the multiferroic layer 2 whose crystal structure is rhombohedral with the ferromagnetic layer 1 is better than that of the multiferroic layer 2 whose crystal structure is tetragonal with the ferromagnetic layer 1, occurrence of lattice distortion at an interface can be prevented.

The first effect is caused by an exchange interaction between the magnetization of the multiferroic layer 2 and the magnetization of the ferromagnetic layer 1. A distance of reach of an exchange bias causing an exchange interaction is short. For this reason, when the rhombohedral crystal region R having excellent ferromagnetic characteristics is disposed on the multiferroic layer 2 on the surface 2a side, the first effect can be effectively exerted on the ferromagnetic layer 1.

On the other hand, the second effect is caused by dielectric polarization of the multiferroic layer 2. A portion due to which dielectric polarization is strongly expressed is the tetragonal crystal region T. A distance at which an electric field caused by dielectric polarization can affect the magnetization of the ferromagnetic layer 1 is greater than a distance at which an exchange bias reaches. For this reason, the second effect can be sufficiently effectively exerted on the ferromagnetic layer 1 even when the second region 2B including the tetragonal crystal region T is present further inside the multiferroic layer 2 than the first region 2A.

A thickness of the first region 2A is preferably 2 nm or more, more preferably 4 nm or more, and even more preferably 10 nm or more. In other words, the thickness of the first region 2A is preferably 5 unit cells or more, more preferably 10 unit cells or more, and even more preferably 25 unit cells or more in a unit lattice of a crystal structure to be formed.

The thickness of the first region 2A is equal to a maximum thickness of the rhombohedral crystal region R. If a thickness of the rhombohedral crystal region R is sufficiently thick, the orientation of the magnetization in the rhombohedral crystal region R becomes uniform such that characteristics of high ferromagnetism or anti-ferromagnetism can be expressed. If characteristics of high ferromagnetism or anti-ferromagnetism are expressed by the rhombohedral crystal region R, the first effect can be exerted on the ferromagnetic layer 1 to a greater extent.

An area occupied by the rhombohedral region R when the first region 2A is viewed in a plan view is preferably 30% or more of an area of the surface 2a of the multiferroic layer 2, more preferably 50% or more, and even more preferably 70% or more. The rhombohedral region R in the first region 2A primarily causes an exchange interaction. For this reason, when the area of the rhombohedral region R in the first region 2A is increased, the more the first effect can be exerted on the ferromagnetic layer 1.

The second region upper surface 2Ba is preferably present within 300 nm from the surface 2a of the multiferroic layer 2, more preferably present within 200 nm, and even more preferably present with 100 nm.

When the second region 2B is too far away from the surface 2a of the multiferroic layer 2, an amount of an effect of the second effect of the tetragonal crystal region T exerted on the ferromagnetic layer 1 is small. In other words, when the second region 2B is present within a predetermined range from the surface 2a of the multiferroic layer 2, the second effect can be effectively exerted on the ferromagnetic layer 1.

Also, an area occupied by the tetragonal crystal region T when the second region 2B is viewed in the plan view is preferably 30% or more of the area of the surface 2a of the multiferroic layer 2, more preferably 50% or more, and even more preferably 70% or more. The tetragonal crystal region T in the second region 2B mainly exerts the second effect on the magnetization of the ferromagnetic layer 1 by dielectric polarization. For this reason, when the area of the tetragonal crystal region T in the second region 2B increases, the more the second effect can be exerted on the ferromagnetic layer 1.

Figure 3:
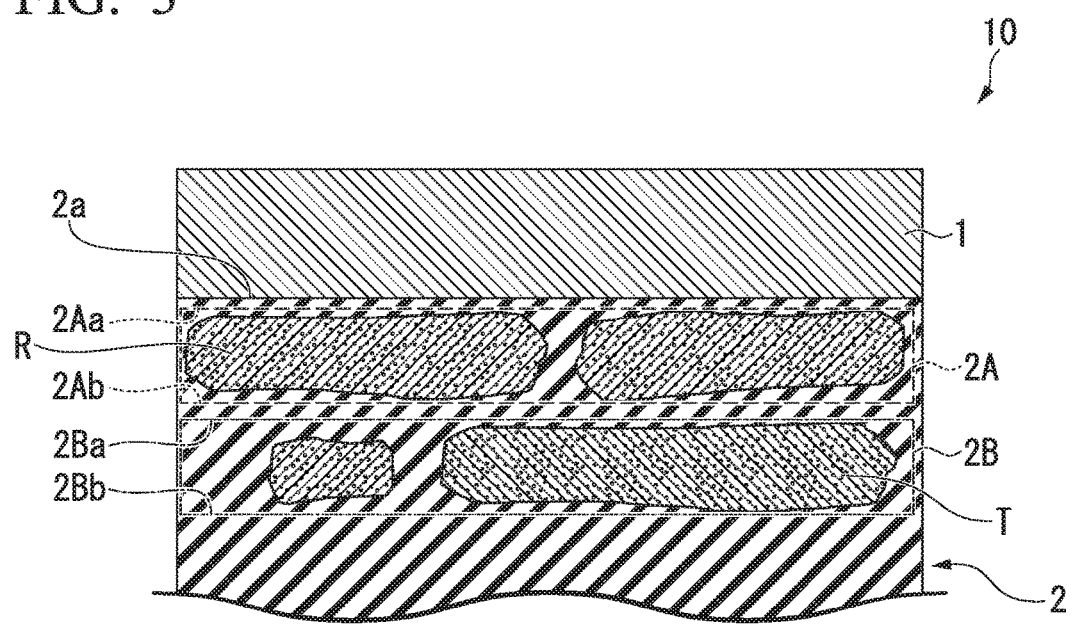
FIG. 3 is a diagram schematically illustrating a cross section of another example of the laminated structure according to the embodiment.

In FIG. 2, each of the rhombohedral crystal region R and the tetragonal crystal region T forms one domain in each of the first region 2A and the second region 2B of the multiferroic layer 2. On the other hand, a constitution in which a plurality of rhombohedral crystal regions R are provided in the first region 2A and a plurality of tetragonal crystal regions T are provided in the second region 2B may be adopted as illustrated in FIG. 3. Furthermore, a constitution in which only a plurality of rhombohedral crystal regions R are provided or a constitution in which only a plurality of tetragonal crystal regions T are provided may be adopted. FIG. 3 is a diagram schematically illustrating a cross section of another example of the laminated structure 10 according to the embodiment.

If a plurality of rhombohedral crystal regions R are provided in the first region 2A or a plurality of tetragonal crystal regions T are provided in the second region 2B, localization of a portion of the ferromagnetic layer 1 on which the first effect is strongly exerted and a portion of the ferromagnetic layer 1 on which the second effect is strongly exerted can be prevented. In other words, the first effect and the second effect can be uniformly exerted on the entire ferromagnetic layer 1.

A layer thickness of the multiferroic layer 2 is preferably 100 nm or more and 500 nm or less, more preferably 150 nm or more and 400 nm or less, and even more preferably 200 nm or more and 350 nm or less. When the layer thickness of the multiferroic layer 2 becomes too thick, an amount of charge induced on the surface 2a of the multiferroic layer 2 decreases. On the other hand, when the layer thickness of the multiferroic layer 2 is too thin, the multiferroic layer 2 does not express sufficient ferromagnetism characteristics and ferroelectric characteristics in some cases.

"Nonmagnetic Layer"

The nonmagnetic layer 20 may be an insulator, a semiconductor, or a metal. When the nonmagnetic layer 20 is made of an insulator, a laminate constituted of the ferromagnetic layer 1, the nonmagnetic layer 20, and the second ferromagnetic layer 30 is set as a tunneling magnetoresistance (TMR) element. In addition, when the nonmagnetic layer 20 is made of a semiconductor or a metal, a laminate constituted of the ferromagnetic layer 1, the nonmagnetic layer 20, and the second ferromagnetic layer 30 is set as a giant magnetoresistance (GMR) element.

Known materials can be used for the nonmagnetic layer 20.

For example, when the nonmagnetic layer 20 is made of an insulator or a semiconductor, hexagonal-BN, graphene, $HfO_2$, $Y_2O_3$, TaO, GaO, TiO, InO, BaO, $CaF_2$, $Al_2O_3$, $SiO_2$, MgO, $MgAl_2O_4$, or the like can be used as its material. Among these, since MgO and $MgAl_2O_4$ are materials by which coherent tunneling can be realized, an MR ratio can be increased. Furthermore, materials obtained by substituting a part or all of Mg and Al of MgO and $MgAl_2O_4$ with Zn, Cd, Ag, Pt, Pb, Ga, In, Ge, or the like can also be used for the nonmagnetic layer 20.

Also, when the nonmagnetic layer 20 is made of a metal, Cu, Au, Ag, or the like can be used as its material.

"Second Ferromagnetic Layer"

The second ferromagnetic layer 30 forms a magnetoresistive effect element together with the ferromagnetic layer 1 and the nonmagnetic layer 20. When the ferromagnetic layer 1 is a fixed layer, the second ferromagnetic layer 30 is a free layer. In addition, when the ferromagnetic layer 1 is a free layer, the second ferromagnetic layer 30 is a fixed layer.

Known materials can be used as a material of the second ferromagnetic layer 30. For example, a metal selected from the group consisting of Cr, Mn, Co, Fe, and Ni and an alloy which includes one or more of these metals and has ferromagnetism can be used. Furthermore, an alloy containing one or more of these metals and at least one element of B, C, and N can also be used. To be specific, Co—Fe and Co—Fe—B may be exemplified. In order to obtain a higher output, a Heusler alloy may be used for the second ferromagnetic layer 30.

(Method for Manufacturing Spin Modulation Element)

A method for manufacturing the spin modulation element 100 will be described. First, a base material is prepared. It is desirable to use a material having conductivity as the base material such that a voltage is applied in the lamination direction of the laminated structure 10. When the base material has conductivity, the base material can also serve as an electrode.

Subsequently, the multiferroic layer 2 is laminated above the prepared base material. Examples of a laminating method include a sputtering method, a chemical vapor deposition (CVD) method, a molecular beam epitaxial (MBE) method, and the like.

A crystalline phase of the multiferroic layer 2 is adjusted using a difference in crystalline state between a substrate above which the multiferroic layer 2 is laminated and the multiferroic layer 2. A case in which the multiferroic layer 2 is made of $BiFeO_3$ will be described in detail as an example. First, a (001) $LaAlO_3$ substrate having a smaller lattice constant than that of a rhombohedral crystal phase of $BiFeO_3$ is prepared. A substrate temperature is set to 700° C.

and a film of BiFeO$_3$ is formed above the (001) LaAlO$_3$ substrate with a layer thickness of 300 nm.

A crystalline phase of BiFeO$_3$ at an initial film formation stage thereof is a tetragonal crystal phase because BiFeO$_3$ undergoes compressive stress from the (001) LaAlO$_3$ substrate. On the other hand, when a formed film thickness of BiFeO$_3$ increases, a crystalline phase gradually relaxes to a normally stable rhombohedral crystal phase. For this reason, when film formation is stopped at a time when a formed film thickness of the entire surface reaches a formed film thickness of about 300 nm in which the crystalline phase thereof relaxes to a rhombohedral crystal phase, a surface which includes both of the tetragonal crystal phase and the rhombohedral crystal phase can be formed. In other words, the first region 2A and the second region 2B are formed on the multiferroic layer 2 in a predetermined order. It should be noted that a film thickness required for relaxing a compressive stress changes depending on a substrate, a lattice constant of a multiferroic layer to be formed, and the like.

Subsequently, the ferromagnetic layer 1, the nonmagnetic layer 20, and the second ferromagnetic layer 30 are sequentially laminated above the multiferroic layer 2. These layers can be laminated in the same manner as a ferromagnetic layer and a nonmagnetic layer of a magnetoresistive effect element such as a GMR element and a TMR element. For example, a sputtering method, an evaporation method, a laser ablation method, an MBE method, or the like can be used. Furthermore, it is desirable to laminate an electrode on a surface of the second ferromagnetic layer 30 opposite to the nonmagnetic layer 20. When the electrode is provided, a current can flow uniformly over the entire surface of the ferromagnetic layer 1.

(Operation of Spin Modulation Element)

Next, an operation of a spin modulation element will be described and how multivaluing is realized will be described.

FIGS. 4A to 4D are schematic diagrams for explaining an operation of the spin modulation element 100. The spin modulation element 100 includes a switch SW1 configured to control a current through the second ferromagnetic layer 30 and the ferromagnetic layer 1 and a switch SW2 configured to apply an electric field to the multiferroic layer 2 connected thereto.

Figure 4A:
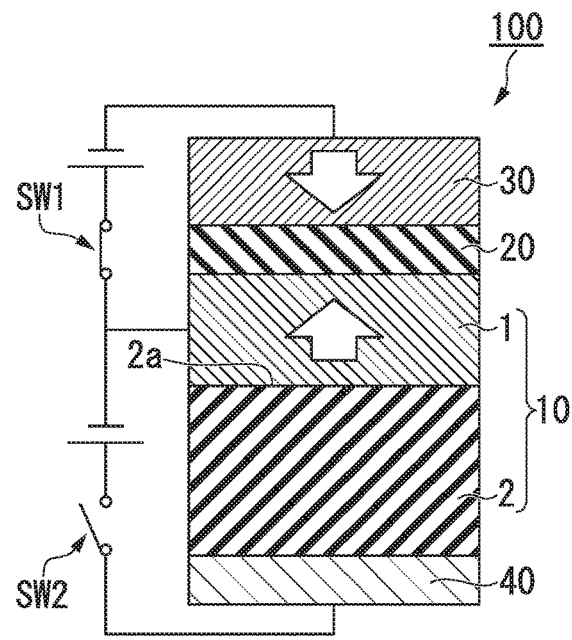
FIG. 4A is a schematic diagram for explaining an operation of a spin modulation element.
Figure 4B:
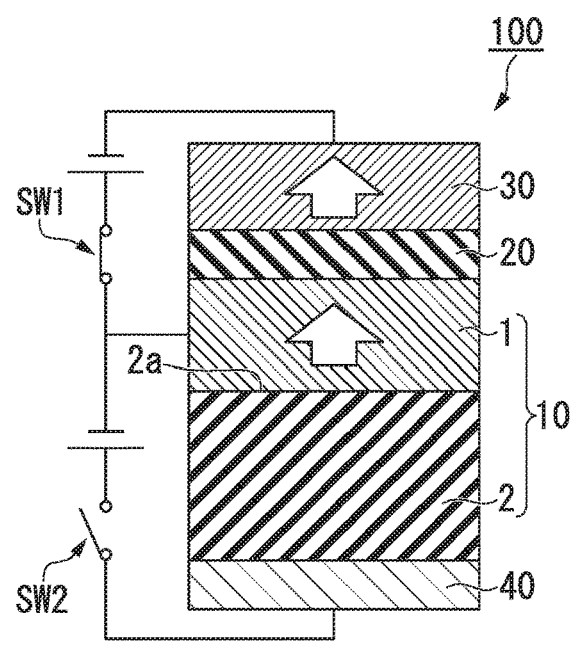
FIG. 4B is a schematic diagram for explaining an operation of a spin modulation element.

First, as illustrated in FIGS. 4A and 4B, when the switch SW2 is opened, an electric field is not applied to the multiferroic layer 2. For this reason, the spin modulation element 100 has two states, i.e., a first state in which magnetization directions of the second ferromagnetic layer 30 and the ferromagnetic layer 1 are anti-parallel (FIG. 4A) and a second state in which magnetization directions of the second ferromagnetic layer 30 and the ferromagnetic layer 1 are parallel (FIG. 4B). A spin polarized current flows in the lamination direction of a laminate due to closing the switch SW1 and the magnetization direction of the ferromagnetic layer 1 is inverted by a spin transfer torque (STT).

Figure 4C:
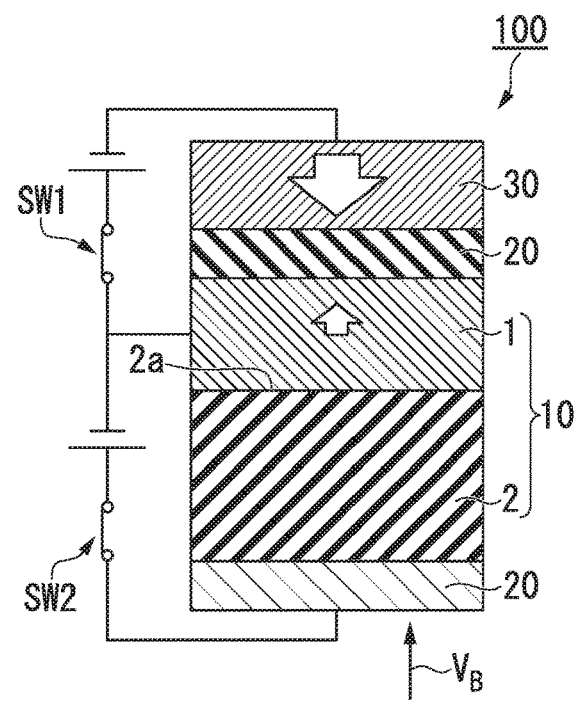
FIG. 4C is a schematic diagram for explaining an operation of a spin modulation element.
Figure 4D:
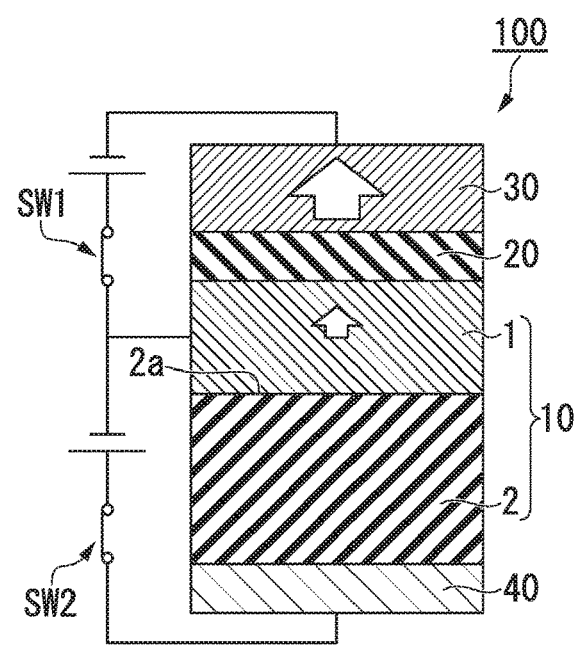
FIG. 4D is a schematic diagram for explaining an operation of a spin modulation element.

Subsequently, as illustrated in FIGS. 4C and 4D, the switch SW2 is closed and an electric field is applied between the ferromagnetic layer 1 and the electrode 40 (to the multiferroic layer 2). When the electric field is applied to the multiferroic layer 2, the multiferroic layer 2 inverts a direction of dielectric polarization. An electric field generated by the dielectric polarization changes a band structure of the ferromagnetic layer 1 and modulates the spin polarizability of the ferromagnetic layer 1.

For example, when a positive voltage is applied to the multiferroic layer 2 (in a voltage $V_B$ direction in FIG. 4C), band bending is induced in a down-spin band structure of the ferromagnetic layer 1 by an electric field. For this reason, a small number of spin carriers are induced at an interface of the ferromagnetic layer 1 on the multiferroic layer 2 side and spin polarizability of the ferromagnetic layer 1 is decreased. In FIGS. 4C and 4D, a decrease in spin polarizability is schematically illustrated using a size of an arrow.

As illustrated in FIGS. 4C and 4D, two states, i.e., a third state in which magnetization directions of the second ferromagnetic layer 30 and the ferromagnetic layer 1 are anti-parallel (FIG. 4C) and a fourth state in which magnetization directions of the second ferromagnetic layer 30 and the ferromagnetic layer 1 are parallel (FIG. 4D) are provided even in a state in which spin polarizability of the ferromagnetic layer 1 is decreased.

In other words, in the spin modulation element 100 four states are caused by controlling the switch SW1 and the switch SW2. In the four states, resistance values thereof increase in order of a first state, a third state, a fourth state, and a second state.

Since the magnetization of the ferromagnetic layer 1 is firmly fixed when the surface 2a of the multiferroic layer 2 has the first region 2A, a difference in resistance value between the first state and the second state increases. Furthermore, when the second region 2B is provided within a predetermined range from the surface 2a of the multiferroic layer 2, a change in spin polarizability due to dielectric polarization increases and differences in resistance value between the first state and the third state and between the second state and the fourth state increase.

Since the multiferroic layer 2 includes the first region 2A having the rhombohedral crystal region R and the second region 2B having the tetragonal crystal region T in a predetermined order in the spin modulation element 100 according to the embodiment as described above, differences in resistance value between the four states can be increased and stable multiple value recording can be performed.

Although the embodiments of the present disclosure have been described above with reference to the drawings, each constitution in each embodiment, a combination thereof, and the like are merely examples and additions, omissions, substitutions, and other modifications of the constitution are possible without departing from the scope of the present invention.

EXPLANATION OF REFERENCES

1 Ferromagnetic layer
2 Multiferroic layer
2a Surface
2A First region
2B Second region
10 Laminated structure
20 Nonmagnetic layer
30 Second ferromagnetic layer
40 Electrode
100 Spin modulation element
SW1, SW2 Switch

What is claimed is:
1. A laminated structure, comprising:
a ferromagnetic layer; and
a multiferroic layer formed on one surface of the ferromagnetic layer,
wherein the multiferroic layer includes a first region having a rhombohedral crystal located on a surface side on the ferromagnetic layer side and a second region having a tetragonal crystal located further inside than the first region.

2. The laminated structure according to claim 1, wherein a thickness of the first region is 2 nm or more.

3. The laminated structure according to claim 1, wherein one surface of the second region on the ferromagnetic layer side is present within 300 nm from a surface of the multiferroic layer on the ferromagnetic layer side.

4. The laminated structure according to claim 1, wherein a portion of the first region having a rhombohedral crystal structure occupies an area of 30% or more of one surface of the multiferroic layer when the multiferroic layer is viewed in a plan view in a lamination direction.

5. The laminated structure according to claim 1, wherein a portion of the second region having a tetragonal crystal structure occupies an area of 30% or more of one surface of the multiferroic layer when the multiferroic layer is viewed in a plan view in the lamination direction.

6. The laminated structure according to claim 1, wherein a plurality of portions of the first region having a rhombohedral crystal structure are present and a plurality of portions of the second region having a tetragonal crystal structure are present.

7. The laminated structure according to claim 1, wherein the multiferroic layer includes any one selected from the group consisting of $BiFeO_3$, $BiMnO_3$, $GaFeO_3$, $AlFeO_3$, $(Ga, Al)FeO_3$, $YMnO_3$, $CuFeO_2$, $Cr_2O_3$, $Ni_3Bi_7O_{13}I$, $LiMnPO_4$, $Y_3Fe_5O_{12}$, $TbPO_4$, and $LiCoPO_4$.

8. The laminated structure according to claim 1, wherein the ferromagnetic layer is a half metal.

9. The laminated structure according to claim 1, wherein the ferromagnetic layer includes a Heusler alloy represented by a composition expression of $X_2YZ$, X in the composition expression is a transition metal element or a noble metal element from the Co, Fe, Ni, or Cu group in the periodic table, Y is a transition metal from the Mn, V, Cr, or Ti group or the element types for X, and Z is a typical element from Group III to Group V.

10. A spin modulation element, comprising:
the laminated structure according to claim 1; and
a nonmagnetic layer and a second ferromagnetic layer sequentially laminated on the ferromagnetic layer of the laminated structure.

11. The laminated structure according to claim 2, wherein one surface of the second region on the ferromagnetic layer side is present within 300 nm from a surface of the multiferroic layer on the ferromagnetic layer side.

12. The laminated structure according to claim 2, wherein a portion of the first region having a rhombohedral crystal structure occupies an area of 30% or more of one surface of the multiferroic layer when the multiferroic layer is viewed in a plan view in a lamination direction.

13. The laminated structure according to claim 3, wherein a portion of the first region having a rhombohedral crystal structure occupies an area of 30% or more of one surface of the multiferroic layer when the multiferroic layer is viewed in a plan view in a lamination direction.

14. The laminated structure according to claim 11, wherein a portion of the first region having a rhombohedral crystal structure occupies an area of 30% or more of one surface of the multiferroic layer when the multiferroic layer is viewed in a plan view in a lamination direction.

15. The laminated structure according to claim 2, wherein a portion of the second region having a tetragonal crystal structure occupies an area of 30% or more of one surface of the multiferroic layer when the multiferroic layer is viewed in a plan view in the lamination direction.

16. The laminated structure according to claim 3, wherein a portion of the second region having a tetragonal crystal structure occupies an area of 30% or more of one surface of the multiferroic layer when the multiferroic layer is viewed in a plan view in the lamination direction.

17. The laminated structure according to claim 4, wherein a portion of the second region having a tetragonal crystal structure occupies an area of 30% or more of one surface of the multiferroic layer when the multiferroic layer is viewed in a plan view in the lamination direction.

18. The laminated structure according to claim 11, wherein a portion of the second region having a tetragonal crystal structure occupies an area of 30% or more of one surface of the multiferroic layer when the multiferroic layer is viewed in a plan view in the lamination direction.

19. The laminated structure according to claim 12, wherein a portion of the second region having a tetragonal crystal structure occupies an area of 30% or more of one surface of the multiferroic layer when the multiferroic layer is viewed in a plan view in the lamination direction.

20. The laminated structure according to claim 13, wherein a portion of the second region having a tetragonal crystal structure occupies an area of 30% or more of one surface of the multiferroic layer when the multiferroic layer is viewed in a plan view in the lamination direction.

* * * * *